United States Patent [19]

Tan

[11] Patent Number: 5,280,256
[45] Date of Patent: Jan. 18, 1994

[54] LIMITING FILTER

[75] Inventor: Robert J. Tan, Beltsville, Md.

[73] Assignee: The United States of America as represented by the Secretary of the Army, Washington, D.C.

[21] Appl. No.: 749,350

[22] Filed: Aug. 23, 1991

[51] Int. Cl.$^5$ .......................... H03H 7/00; H01P 1/20
[52] U.S. Cl. .................................. 333/167; 333/204; 333/219; 333/81 R
[58] Field of Search ............... 333/167, 202, 203, 205, 333/219, 207, 209, 17.2, 81 R; 307/542, 543, 551, 561, 559; 333/202 DB, 206, 208, 81 A, 81 B, 204

[56] References Cited

U.S. PATENT DOCUMENTS

| | | | |
|---|---|---|---|
| 3,098,937 | 7/1963 | Martens | 307/551 |
| 4,016,514 | 4/1977 | Reeder et al. | 333/150 X |
| 4,467,296 | 8/1984 | Cohen et al. | 333/202 |
| 5,021,757 | 6/1991 | Kobayashi et al. | 333/205 |

FOREIGN PATENT DOCUMENTS 0223304 11/1985 Japan.
1465925 3/1989 U.S.S.R..

OTHER PUBLICATIONS

Garver, "Microwave Diode Control Devices," Artech House, Inc., (1976), Chapter 9 Limiters.
"Characteristics of Semiconductor Limiter Diodes," Alpha Inc., Application Note 8030, pp. 3-45 to 3-56.
Matthaei et al., "Microwave Filters, Impedance-Matching Networks, and Coupling Structures," McGraw-Hill Book Co. (1964), Sec. 8.09, pp. 472-476.
Tan et al., "Dual-Diode Limiter For High Power Low-Spike-Leakage Applications," IEEE MTT Symposium Digest, paper R-31, (1990), pp. 757-760.
Denig, "Using Microwave CAD Programs to Analyze Microstrip Intergitial Filters," Microwave Journal, (Mar. 1989)., pp. 147-152.

Primary Examiner—Robert J. Pascal
Assistant Examiner—Ali Neyzari
Attorney, Agent, or Firm—Saul Elbaum; Guy M. Miller; Frank J. Dynda

[57] ABSTRACT

A limiting filter has nonlinear signal limiting devices integrally connected to the filter structure so that as the power level of input signals increase the nonlinear signal limiting devices decrease their impedance in response thereto, detuning the filter. Filter isolation thus becomes a function of both frequency and input power.

7 Claims, 6 Drawing Sheets

LIMITING FILTER

RIGHTS OF THE GOVERNMENT

The invention described herein may be manufactured, used and licensed by or for the United States Government for Governmental purposes without payment to me of any royalty thereon.

BACKGROUND OF THE INVENTION

1. Field of the Invention

The present invention relates to filters and, more particularly, to a limiting filter in which microwave signal limiting devices have been integrally incorporated into the filter structure.

2. Description of the Prior Art

Filters are used to prevent receiver interference from out-of-band signals. Limiters are used to prevent transient rf pulses from damaging sensitive, low-noise microwave components. Currently, microwave receiver front-ends are commonly preceded by either a filter, a limiter or both. In cases where unwanted signals are out of the frequency band of the receiver filters are used to remove these signals. In cases where there are unwanted signals within the operating band of the receiver limiters can be used when the unwanted signals are at a higher level than the desired signal. In cases where there are both out of band and high level inband unwanted signals both a filter and limiter are commonly used. These two devices are normally combined in a series arrangement with the limiter following the filter. The use of two separate devices is costly and takes up unnecessary space.

SUMMARY OF THE INVENTION

It is therefore an object of this invention to reduce the need for separate filter and limiter components in microwave receivers and other systems requiring filtering and limiting.

The job performed by the present invention is currently accomplished with the combination of a filter and one of a variety of existing protection or signal limiting type devices. The present invention is essentially a filter modified by the addition of PIN diode limiters or other signal limiting type devices, such as MOVs, terminal protection devices, plasmas, and arcing devices, which give the filter nonlinear limiting properties in its passband. While discussion in this specification will concentrate on microwave filters and PIN diode limiters, the type of limiting devise employed can vary upon the results desired and application involved.

A limiter incorporated within the design of a filter has many advantages. First, it is more compact than a separate filter and limiter. Second, because of the design of many microwave filters, the proper placement of limiter diodes can provide greater passband isolation in the on state than could be achieved with the same number of diodes in a standard limiter design. Third, a limiting filter can be fabricated easily in existing microwave circuit structures (i.e., microstrip, monolithic, etc.) using existing filter design methods. Fourth, the PIN diodes could prevent arcing in filters at very high powers.

The present limiting filter has several disadvantages. First, the limiting filter tends to have more insertion loss because the Q of the PIN diode is less than the standard resonator. Second, because of the nonlinear properties of diodes at intermediate power levels, the diodes could generate harmonics that could be a problem with some applications. To date this phenomenon has not been seen. Third, if the junction capacitance of the diode varies, the frequency response of the limiting filter will also vary. This effect has not been seen because as the junction capacitance changes, the junction resistance changes, which seems to dominate the frequency response of the limiting filter.

The foregoing and other objects and advantages of the invention will appear from the following description. In the description reference is made to the accompanying drawings which form a part hereof, and in which there is shown by way of illustration and not of limitation a preferred embodiment. Such description does not represent the full extent of the invention, but rather the invention may be employed in different arrangements according to the breadth of the invention.

DESCRIPTION OF THE PREFERRED EMBODIMENTS

The present invention will be described for three types of filters for illustration but is in no way limited to these specific embodiments; a bandpass filter using quarter-wavelength shorted stubs and quarter-wavelength connecting lines, a bandpass interdigital filter, and a bandpass coupled-line filter. All three types of filters are designed in either stripline or microstrip, are passive, and have been simulated on a computer aided design (CAD) program called Touchstone® by EEsof Inc.

Figure 1:
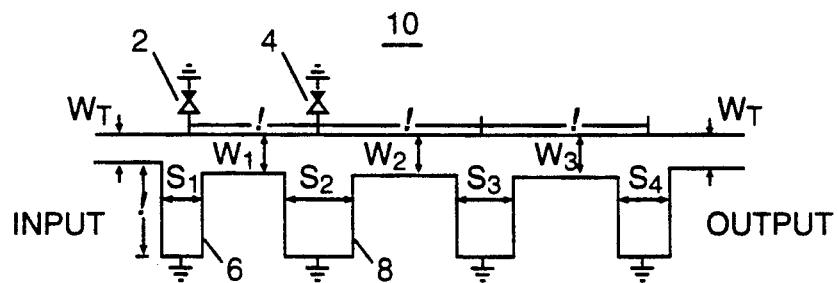
FIG. 1 shows a four-pole Tchebyscheff 0.5-dB ripple 1- to 2-GHz bandpass limiting filter in stripline transmission line according to an aspect of the invention.
Figure 2:
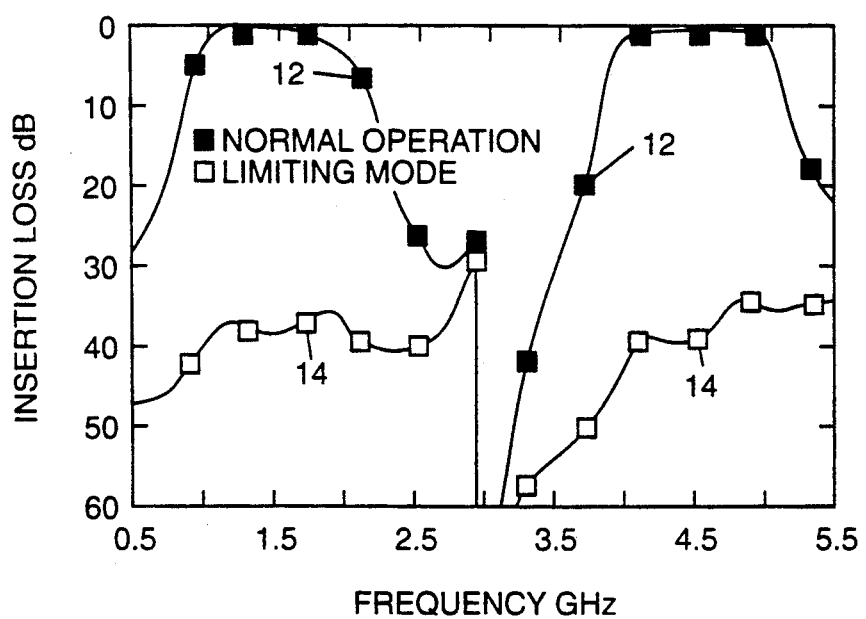
FIG. 2 shows a computer generated response of the $S_{21}$ parameters of the four-pole Tchebyscheff 0.5-dB ripple 1- to 2-GHz bandpass limiting filter of FIG. 1.
Figure 3:
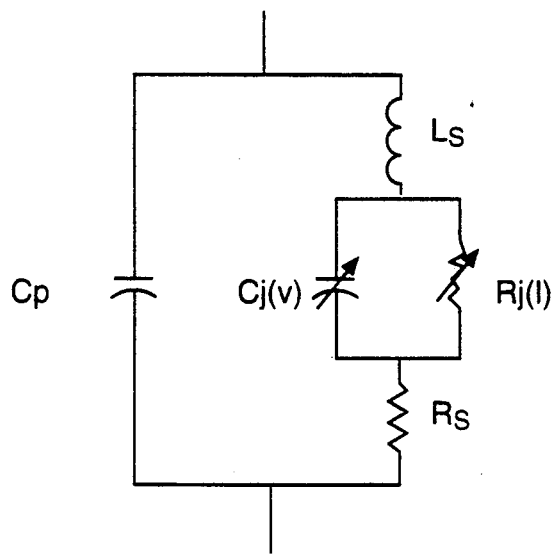
FIG. 3 shows the diode equivalent circuit for modeling the limiting devices in the computer generated response referred to in FIG. 2.
Figure 4:
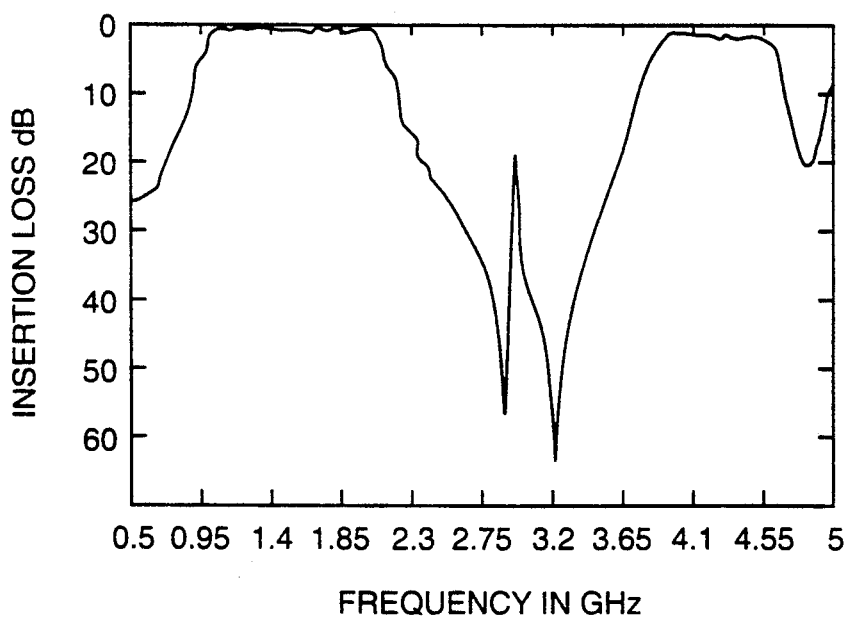
FIG. 4 shows actual network analyzer measurements of the $S_{21}$ parameters of the four-pole Tchebyscheff 0.5-dB ripple 1- to 2-GHz bandpass limiting filter of FIG. 1.
Figure 5:
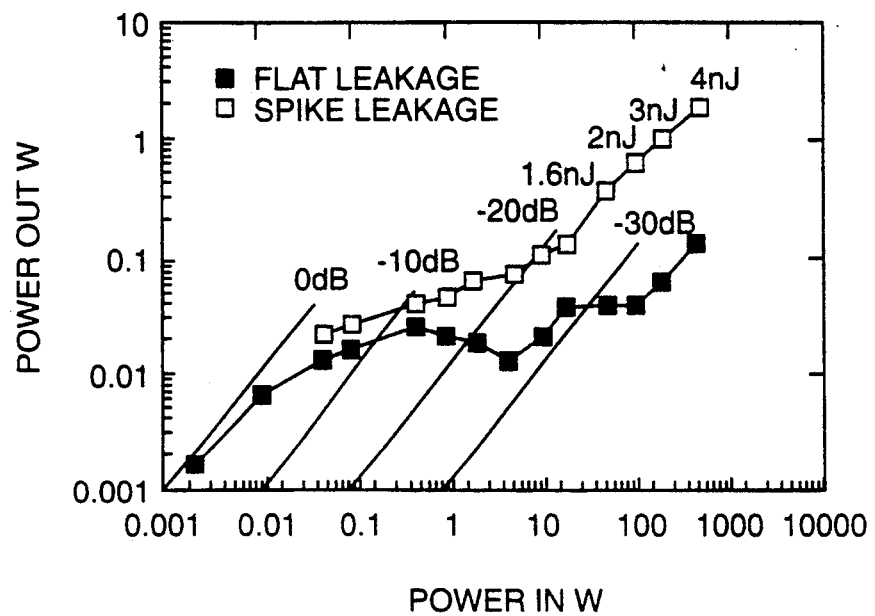
FIG. 5 shows the high-power characteristics, output power versus input power, of the four-pole Tchebyscheff 0.5-dB ripple 1- to 2-GHz bandpass limiting filter of FIG. 1.

FIG. 1 shows a quarter-wave shorted-stub filter 10 in a four-pole, 0.5-dB Tchebyscheff ripple design, with a 1.0- to 2.0-GHz passband. This filter design is based on standard filter design theory. This limiting filter 10 was fabricated in stripline using 1/16-in. $\epsilon_r=2.55$ substrate, where $W_T=90.6$ mills, $1=1232.3$ mils, $W_1=185$ mils, $W_2=232.3$ mils, $W_3=185$ mils, $S_1=185$ mils, $S_2=409.5$ mils, $S_3=338.6$ mils, and $S_4=126$ mils. The filter can also be fabricated in microstrip. The filter 10 includes the addition of two PIN diodes 2 and 4 (Alpha Inc. package 375-001) by integrally connecting them a quarter wavelength apart at voltage maxima on the first two input stubs 6 and 8 respectively. The filter circuit 10 of FIG. 1 was modeled on Touchstone®, and the calculated $S_{21}$ parameters are plotted in FIG. 2, (insertion loss dB verses frequency GHz), for both normal low-power operation 12 and limiting mode 14. The PIN diodes 2 and 4 are modeled using the circuit in FIG. 3, where junction resistance, $R_j=2\Omega$ or 2 M$\Omega$ for on or off states, respectively; package capacitance, $C_p=0$; junction capacitance, $C_j(0)=0.15$ pF; series resistance, $R_s=1\Omega$; and series inductance $L_s=0.1$ nH. Two diodes in this limiting filter provide over 35 dB of isolation without affecting the stop band of the filter. Diode 2 has a 5-micrometer-thick intrinsic region (I-region) as the input diode, and diode 4 has a 1-micrometer-thick I-region as the output diode (see FIG. 1). The purpose of different I-region-thickness diodes is to give the limiting filter higher power handling capability and lower spike leakage energies. Network analyzer measurements of $S_{21}$, which are shown in FIG. 4 for 0-dBm input, compare well with the simulated response shown in FIG. 2. The high-power characteristics, which were measured in the passband (1.5 GHz), are shown in FIG. 5 as a plot of output power versus input power. At 1.5 GHz, the limiting filter provides over 30 dB of protection for inputs over 35 W. It is predicted that measured high-power results would compare well to the CAD results since the point at 1.5 GHz compare well. The spike leakage was also measured and is also shown in FIG. 5. With a 500-w, 1-ns-risetime input pulse, the spike leakage was 4 nJ.

Figure 6:
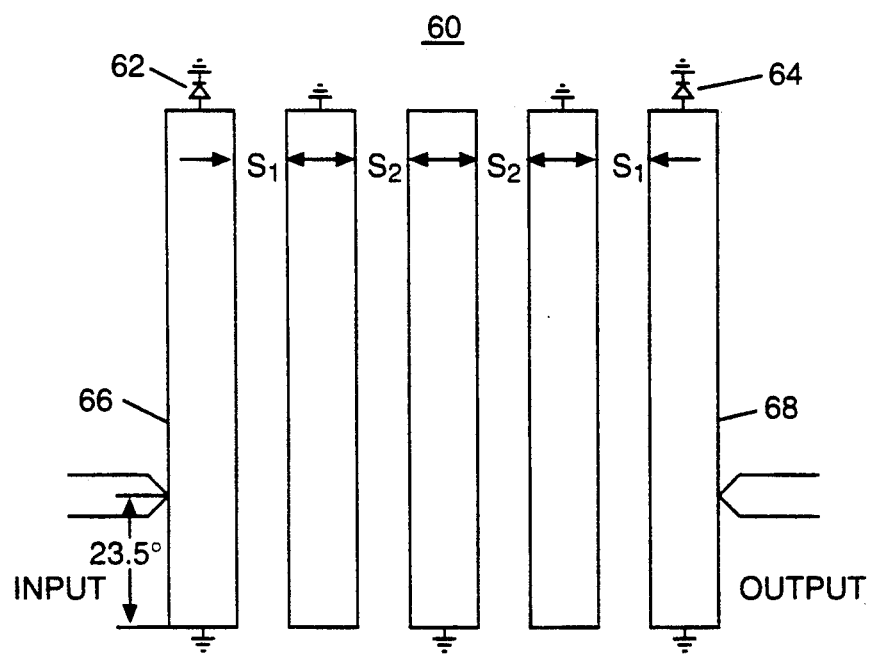
FIG. 6 shows a five-pole Tchebyscheff 0.1-dB ripple, 2.8- to 3.4-GHz bandpass interdigital limiting filter according to another aspect of the invention.
Figure 7:
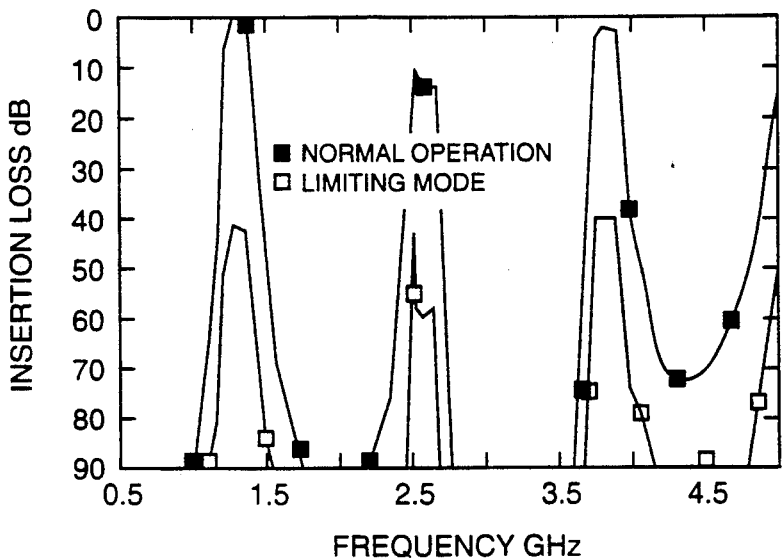
FIG. 7 shows a computer generated response of the $S_{21}$ parameters of the five-pole Tchebyscheff 0.1-dB ripple, 2.8- to 3.4-GHz bandpass interdigital limiting filter of FIG. 6.

FIG. 6 shows an interdigital limiting filter 60 that uses the design of an existing five-pole, 0.1-dB Tchebyscheff ripple, 2.8- to 3.4-GHz passband interdigital filter. PIN diodes 62 and 64 are placed at voltage maxima of input 66 and output 68 elements. The circuit 60 was simulated on 25 mil, $\epsilon_r=9.9$ alumina, where all filter elements are 23.6 mils wide, quarter wavelength long, $S_1=28.3$, and $S_2=35.8$ mils. In the original filter there were capacitors where the diodes are. The computer model for the diodes is as previously shown in FIG. 3, where $R_j=2$ or 2 M$\Omega$ for on or off states, respectively, $R_s=1\Omega$, $L_s=0.5$ nH, $C_p=0.01$ pF, and $C_j(0)=0.15$ pF. The calculated $S_{21}$ parameter response of the interdigital limiting filter is shown in FIG. 7. Two curves represent scattering parameter $S_{21}$ characteristics at both low and high input powers. In the on state, the limiting filter provides greater than 20 dB of isolation in the passband and retains its isolation in the stop band. This limiting filter's passband insertion loss was very sensitive to the diode parasitics. One may be able to improve the limiting filter by modifying its design to compensate for these parasitics.

Figure 8:
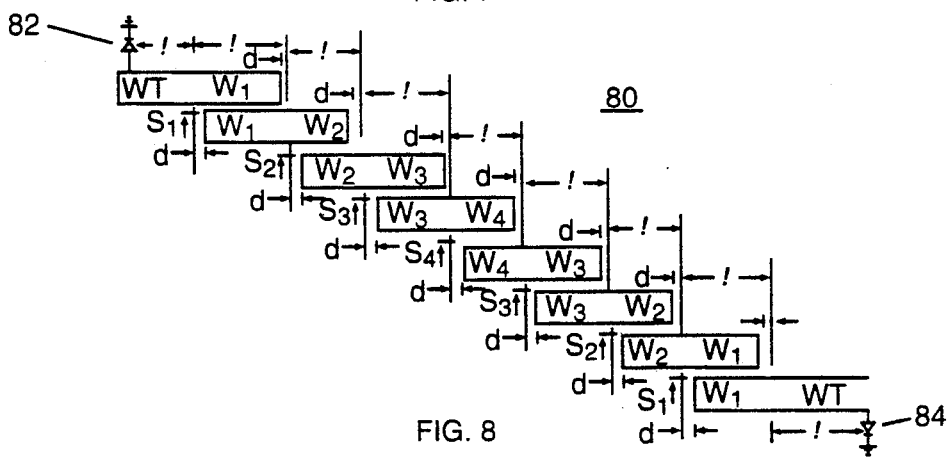
FIG. 8 shows a seven-pole Tchebyscheff 0.01-dB ripple, 1.207 GHz centered bandpass coupled-line limiting filter according to yet another aspect of the invention.
Figure 9:
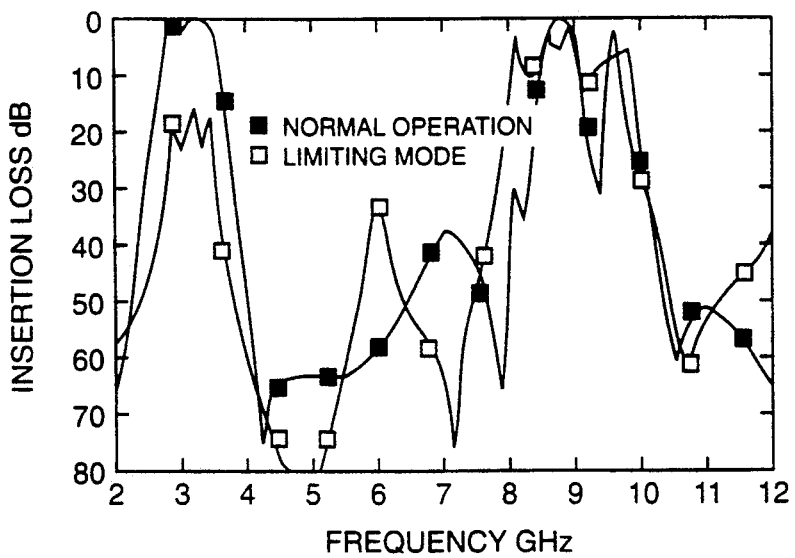
FIG. 9 shows a computer generated response of the $S_{21}$ parameters of the seven-pole Tchebyscheff 0.01-dB ripple, 1.207 GHz centered bandpass coupled-line limiting filter of FIG. 8.

FIG. 8 shows a bandpass coupled-line limiting filter 80 that uses a filter design from Matthaei et al. "Microwave Filters, Impedance-Matching Networks, and Coupling Structures," McGraw-Hill Book Co. (1964), which describes a seven-pole 0.01-dB ripple, Tchebyscheff filter with the bandpass centered at 1.207 GHz. Again, the filter 80 was modified by the use of two PIN diodes 82 and 84 located at voltage maxima at the input and output of the filter. The CAD $S_{21}$ results for both on and off states are plotted from 0.5 to 5.0 GHz in FIG. 9. Over 37 dB of isolation is obtained in the limiting mode in the full sweep from 0.5 to 5 GHz. Note that in the limiting mode, spurious pass bands are also being limited. Because the coupled-line filter has no inherent ground return, one would have to be supplied at the input and output for this particular design to operate most effectively.

Figure 10:
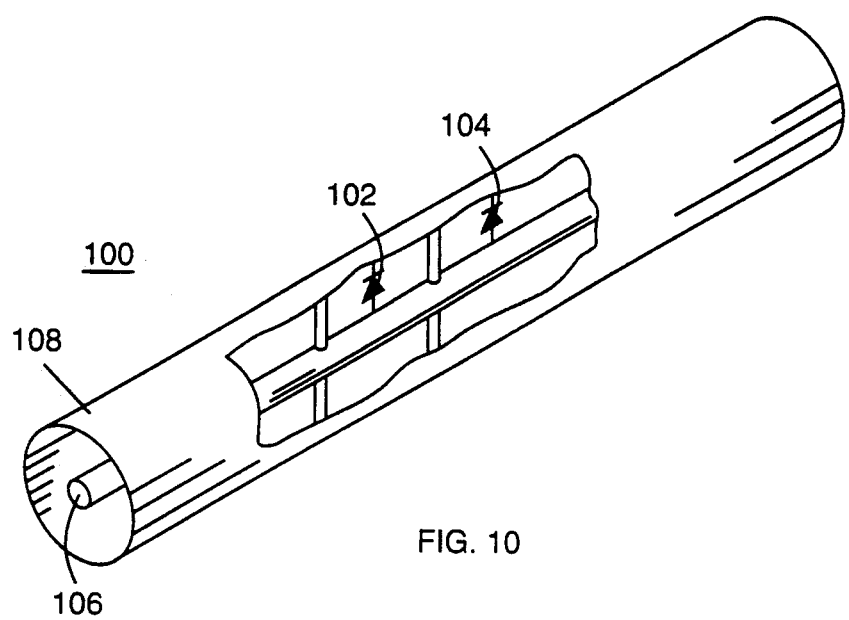
FIG. 10 shows a pictorial view partially cut away of a shunt-inductance reactance-coupled half-wave filter realized in coaxial line according to another aspect of the present invention.

FIG. 10 shows a pictorial view, partially cut away, of a shunt-inductance reactance-coupled half-wave filter 100 realized in coaxial line. PIN diodes 102 and 104 are shown connected between the inner conductor 106 and outer conductor 108 of the coaxial structure.

Figure 11:
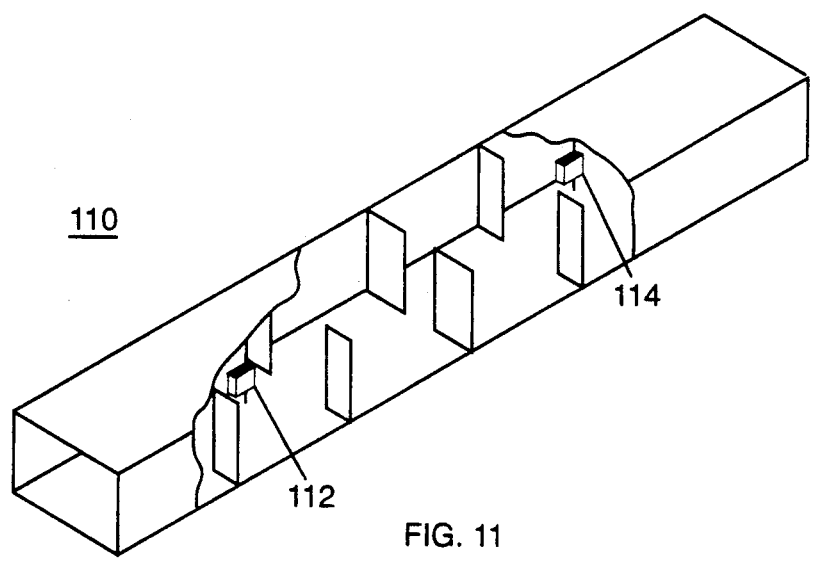
FIG. 11 shows a pictorial view partially cut away of a shunt-inductance reactance-coupled half-wave filter realized in waveguide according to another aspect of the present invention.

FIG. 11 shows a pictorial view partially cut away of a shunt-inductance reactance-coupled half-wave filter 110 realized in waveguide. Signal limiters 112 and 114 are connected as shown. While PIN diode limiters have been discussed up to this point other limiters such as arcing devices, terminal protection devices, plasmas and MOVs can be used for limiters 112 and 114 according to the application and/or desired results.

Figure 12:
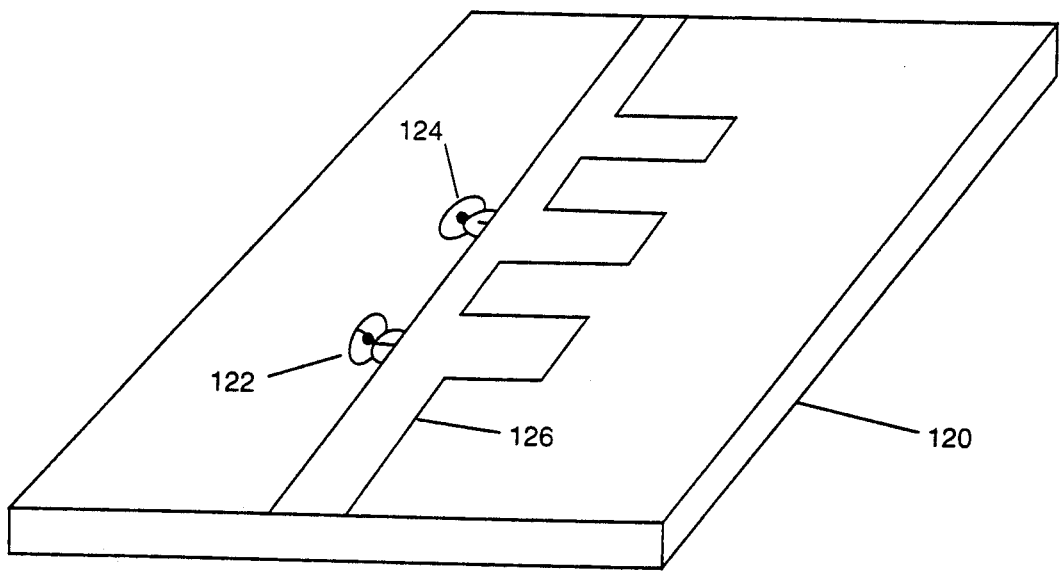
FIG. 12 shows a pictorial view of a monlithic structure using limiting diodes according to another aspect of the inventin.

FIG. 12 shows a pictorial view of a monolithic structure 120 which uses diodes 122 and 124 connected strategically to metalization layer 126.

Obviously, numerous modifications and variations of the present invention are possible in light of the above teachings. It is therefore to be understood that within the scope of the appended claims, the invention may be practices otherwise than as specifically described herein.

I claim:

1. A limiting filter comprising:
   means for filtering input signals, and
   a plurality of nonlinear signal limiting means integrally connected to predetermined positions on said filtering means so that as the power level of the input signals increases said nonlinear signal limiting means decrease their impedance in response thereto thereby providing isolation to said filtering means as a function of the power level of the input signals, and wherein said filtering means is a waveguide, a coaxial line, or a monolithic structure.

2. The limiting filter of claim 1 wherein said plurality of nonlinear signal limiting means comprise arcing devices.

3. The limiting filter of claim 1 wherein said plurality of nonlinear signal limiting means comprise terminal protection devices.

4. The limiting filter of claim 1 wherein said plurality of nonlinear signal limiting means comprise plasmas.

5. The limiting filter of claim 1 wherein said plurality of nonlinear signal limiting means comprise MOVs.

6. The limiting filter of claim 1 wherein said plurality of nonlinear signal limiting means are connected in shunt to filter elements within said filtering means.

7. The limiting filter of claim 1 wherein said plurality of nonlinear signal limiting means are connected to voltage maximums within said filtering means providing high isolation in the limiting mode of the filter.

* * * * *